United States Patent
Shimizu et al.

(10) Patent No.: US 11,519,070 B2
(45) Date of Patent: Dec. 6, 2022

(54) VAPORIZATION DEVICE, FILM FORMATION DEVICE, PROGRAM FOR A CONCENTRATION CONTROL MECHANISM, AND CONCENTRATION CONTROL METHOD

(71) Applicant: HORIBA STEC, Co., Ltd., Kyoto (JP)

(72) Inventors: Toru Shimizu, Kyoto (JP); Masakazu Minami, Kyoto (JP)

(73) Assignee: HORIBA STEC, CO., LTD., Kyoto (JP)

( * ) Notice: Subject to any disclaimer, the term of this patent is extended or adjusted under 35 U.S.C. 154(b) by 182 days.

(21) Appl. No.: 16/778,503

(22) Filed: Jan. 31, 2020

(65) Prior Publication Data
US 2020/0255944 A1    Aug. 13, 2020

(30) Foreign Application Priority Data
Feb. 13, 2019  (JP) .............................. JP2019-023441

(51) Int. Cl.
*C23C 16/52*   (2006.01)
(52) U.S. Cl.
CPC .................................. *C23C 16/52* (2013.01)
(58) Field of Classification Search
CPC ...................................................... C23C 16/52
See application file for complete search history.

(56) References Cited

U.S. PATENT DOCUMENTS

| | | | | |
|---|---|---|---|---|
| 9,416,452 B2* | 8/2016 | Woelk | .................. | C23C 16/4481 |
| 10,066,296 B2* | 9/2018 | Woelk | ...................... | C23C 16/52 |
| 2004/0007180 A1* | 1/2004 | Yamasaki | ............... | C23C 16/16 |
| | | | | 118/715 |
| 2004/0084081 A1* | 5/2004 | Liu | ....................... | G05D 11/132 |
| | | | | 137/113 |
| 2008/0214003 A1* | 9/2008 | Xia | ......................... | C23C 16/06 |
| | | | | 438/686 |
| 2010/0108153 A1* | 5/2010 | Minami | .................. | C30B 25/14 |
| | | | | 137/88 |
| 2010/0108154 A1* | 5/2010 | Minami | ............... | G05D 11/132 |
| | | | | 137/88 |
| 2011/0155264 A1* | 6/2011 | Minami | ............... | G05D 11/138 |
| | | | | 137/467.5 |

(Continued)

FOREIGN PATENT DOCUMENTS

JP        2014-224307        12/2014

*Primary Examiner* — Cachet I Proctor
(74) *Attorney, Agent, or Firm* — Greenblum & Bernstein, P.L.C.

(57) ABSTRACT

In order to inhibit overshoot in the concentration of a source gas immediately after a gas supply period starts, there is provided a vaporization device that is equipped with a vaporization tank that holds a liquid or a solid source, a carrier gas supply path that supplies carrier gas to the vaporization tank, a source gas extraction path along which flows a source gas which is obtained by vaporizing the source and which is extracted from the vaporization tank, a concentration monitor that is provided on the source gas extraction path, and a concentration control mechanism that is provided with a fluid controller which controls a concentration of the source gas extracted from the source gas extraction path. This vaporization device alternates between supplying the source gas and stopping the supply of the source gas.

14 Claims, 7 Drawing Sheets

(56) References Cited

U.S. PATENT DOCUMENTS

| | | | |
|---|---|---|---|
| 2011/0260210 A1* | 10/2011 | Su | H01L 33/0075 |
| | | | 438/23 |
| 2014/0299577 A1* | 10/2014 | Chung | C23C 16/44 |
| | | | 118/712 |
| 2014/0319705 A1* | 10/2014 | Hayashi | G05D 11/138 |
| | | | 261/43 |
| 2017/0101715 A1* | 4/2017 | Nishizato | G01N 21/84 |
| 2018/0258530 A1* | 9/2018 | Sakaguchi | C23C 16/45512 |

* cited by examiner (a)

(b)

VAPORIZATION DEVICE, FILM FORMATION DEVICE, PROGRAM FOR A CONCENTRATION CONTROL MECHANISM, AND CONCENTRATION CONTROL METHOD

TECHNICAL FIELD

The present invention relates to a vaporization device, a film formation device, a program for a concentration control mechanism, and a concentration control method.

TECHNICAL BACKGROUND

A conventional vaporization device that supplies a source gas which is formed by vaporizing a liquid or solid source to a film formation chamber in a semiconductor manufacturing process or the like is described in Patent Document 1. This vaporization device intermittently supplies a carrier gas to a vaporization tank that is holding the source, and, consequently, intermittently extracts from the vaporization tank the source gas formed when this source is vaporized. The extracted source gas is then diluted using a dilution gas, and the resulting mixture gas is then supplied to the chamber.

Note that, in the above-described conventional vaporization device, a structure is employed in which a period when the source gas is being supplied and a period when this supply of source gas is stopped are alternatingly repeated, and feedback control is performed immediately after the gas supply period starts such that an actual concentration of the source gas contained in the mixture gas approaches a predetermined target value.

However, if feedback control is performed immediately after the gas supply period starts, as is the case in the above-described conventional vaporization device, the problem arises that, due to time delays that result from the distances from the concentration monitor to the fluid controllers that are being controlled (more specifically, fluid controllers, pressure controllers, and the like) and the vaporization tank, there is a sizable overshoot in the concentration of the source gas immediately after the gas supply period starts.

DOCUMENTS OF THE PRIOR ART

Patent Documents

[Patent Document 1] Japanese Unexamined Patent Application (JP-A) No. 2014-224307

DISCLOSURE OF THE INVENTION

Problems to be Solved by the Invention

It is therefore a principal object of the present invention to inhibit overshoot in the concentration of a source gas immediately after a gas supply period starts.

Means for Solving the Problem

Namely, a concentration control device according to the present invention is a vaporization device that is equipped with a vaporization tank that holds a liquid or a solid source, a carrier gas supply path that supplies carrier gas to the vaporization tank, a source gas extraction path along which flows a source gas which is obtained by vaporizing the source and which is extracted from the vaporization tank, a concentration monitor that is provided on the source gas extraction path, and a concentration control mechanism that is provided with a fluid controller which controls a concentration of the source gas extracted from the source gas extraction path. This vaporization device alternates between supplying the source gas and stopping the supply of the source gas. Moreover, the concentration control mechanism is equipped with a concentration calculation unit that calculates an actual concentration of the source gas based on an output signal from the concentration monitor, a concentration control unit that, after performing first control in which a control value of the fluid controller forming part of the concentration control mechanism is changed to a predetermined initial setting value during a supply period when the source gas is being supplied, subsequently performs second control in which the concentration control unit performs feedback control by controlling the fluid controller so that the actual concentration approaches a predetermined target value, and a control switching unit that, based on changes in the actual concentration after the concentration control unit has started the first control, switches the control state of the concentration control unit from the first control to the second control.

According to the above-described structure, during a supply period when a source gas is being supplied, because a structure is employed in which, after first control has been performed so as to ensure that a control value of a fluid controller forming part of the concentration control mechanism reaches a predetermined initial setting value, second control is subsequently performed in which the concentration control unit performs feedback control by controlling the fluid controller so as to ensure that the actual concentration approaches a predetermined target value, and additionally, the switch from the first control to the second control is made based on changes in the actual concentration after the first control was started, compared to when feedback control is performed immediately after a gas supply period starts, as is the case in a conventional vaporization device, it is possible to inhibit overshoot immediately after a gas supply period starts. Note that the control value is a value relating to an object being controlled by the fluid controller and shows a flow rate when the fluid controller is a flow rate controller, but shows a pressure when the fluid controller is a pressure controller. In addition, the initial setting value shows a setting value relating to the fluid controller when the gas supply period starts.

As a more specific embodiment, the vaporization device can be further classified into two types, namely, a dilution type (i.e., a flow rate type) and a pressure type. An embodiment of a dilution type of vaporization device is a vaporization device that is further provided with a dilution gas supply path that merges with the source gas extraction path and supplies dilution gas to the source gas extraction path, and in which the concentration control mechanism is provided with the fluid controllers in the form of a first flow rate controller that is provided on the carrier gas supply path and a second flow rate controller that is provided on the dilution gas supply path, and in which, during the supply period when the source gas is being supplied, after the concentration control unit has performed the first control in which the flow rate flowing through the first flow rate controller and the flow rate flowing through the second flow rate controller are controlled respectively so that each flow rate changes to a predetermined initial setting value, the concentration control unit subsequently performs the second control in which the concentration control unit performs feedback control so as to ensure that the actual concentration approaches a predetermined target value by controlling at least one of the flow rate flowing through the first flow rate controller and the flow rate flowing through the second flow rate controller.

An embodiment of a pressure type of vaporization device is a vaporization device in which the concentration control mechanism is provided with the fluid controllers in the form of a flow rate controller that is provided on the carrier gas supply path and a pressure controller that is provided on the source gas extraction path on a downstream side from the concentration monitor, and, during the supply period when the source gas is being supplied, after the concentration control unit has performed first control in which the flow rate flowing through the flow rate controller and a pressure on an upstream side from the pressure controller are controlled respectively so that each of these is set to a predetermined initial setting value, the concentration control unit subsequently performs second control in which the concentration control unit performs feedback control so as to ensure that the actual concentration approaches a predetermined target value by controlling at least one of the flow rate flowing through the flow rate controller and the pressure on the upstream side from the pressure controller.

Moreover, an example of a specific aspect of the control switching unit is an aspect in which the control switching unit switches the control state of the concentration control unit from the first control to the second control based on a rate of change in the actual concentration in relation to elapsed time after the first control was started. An example of an even more specific aspect is an aspect in which the control switching unit switches the control state of the concentration control unit from the first control to the second control when the rate of change in the actual concentration in relation to elapsed time after the first control was started falls below a threshold value.

It is also possible for the control switching unit to switch the control state of the concentration control unit from the first control to the second control when, prior to the rate of change in the actual concentration falling below a threshold value, the elapsed time exceeds a predetermined set time.

If this type of structure is employed, then even if the rate of change in the actual concentration falls below a threshold value due to some reason or other, because the control state of the concentration control unit is forcibly switched from the first control to the second control if the elapsed time exceeds a set time, control of the concentration of the source gas can still be performed.

Note that it is also possible for there to be further provided a threshold value setting unit that sets a threshold value based on changes in the actual concentration after the first control was started. More specifically, it is possible for the threshold value setting unit to set a threshold value based on a maximum value of the rate of change in the actual concentration in relation to the elapsed time after the first control was started, or on the rate of change in the actual concentration after a predetermined time has elapsed from the point in time when the first control was started.

If this type of structure is employed, then even changes in the actual concentration vary due to differences between the sources being supplied or the like, it is still possible to switch from the first control to the second control at an appropriate timing.

In this case, it is also possible for the threshold value setting unit to reset threshold values in each of the supply periods based on changes in the actual concentration after the first control was started for that supply period.

If this type of structure is employed, then even if the initial setting values of the fluid controllers in each supply period are set based on concentration change data which show changes in the actual concentration obtained in the previous supply period, it is still possible to reset the threshold values for each supply period. As a consequence, it is possible to switch from the first control to the second control at an appropriate timing in each supply period.

Moreover, the change in the actual concentration in relation to the elapsed time is unstable immediately after the first control has started. For this reason, it is also possible for a predetermined delay time to be provided after the start of the first control, and for the control switching unit to switch the control state of the concentration control unit from the first control to the second control based on changes in the actual concentration after this delay period. If this type of structure is employed, then it is possible to inhibit erroneous determinations that tend to occur easily in this period when the change in the actual concentration in relation to the elapsed time is unstable.

In order to make it possible to inhibit the amount that an actual concentration undershoots a target value, it is also possible to further provide an initial value setting unit that sets, as the initial setting value, a value obtained by multiplying overshoot gains whose value is one or more by a set value that has been determined so as to enable the actual concentration to reach a preset target value.

A film formation device according to the present invention includes the vaporization device, and a chamber to which the source gas is supplied.

In addition, a program for a concentration control mechanism according to the present invention is used in a vaporization device that is equipped with a vaporization tank that holds a liquid or a solid source, a carrier gas supply path that supplies carrier gas to the vaporization tank, a source gas extraction path along which flows a source gas which is obtained by vaporizing the source and which is extracted from the vaporization tank, a concentration monitor that is provided on the source gas extraction path, and a concentration control mechanism that is provided with a fluid controller which controls a concentration of the source gas extracted from the source gas extraction path. This vaporization device alternates between supplying the source gas and stopping the supply of the source gas. Moreover, the program for a concentration control mechanism causes a computer to perform functions of a concentration calculation unit that calculates an actual concentration of the source gas based on an output signal from the concentration monitor, a concentration control unit that, after performing first control in which a control value of the fluid controller forming part of the concentration control mechanism arrives at a predetermined initial setting value during a supply period when the source gas is being supplied, subsequently performs second control in which, by controlling the fluid controller, the concentration control unit performs feedback control so as to ensure that the actual concentration approaches a predetermined target value, and a control switching unit that, based on changes in the actual concentration after the concentration control unit has started the first control, switches the control state of the concentration control unit from the first control to the second control. Note that this program for a concentration control mechanism may be electronically distributed, or may be recorded on a program recording medium such as a CD, DVD, BD, flash memory, or the like.

A concentration control method according to the present invention is used for a vaporization device that is equipped with a vaporization tank that holds a liquid or a solid source, a carrier gas supply path that supplies carrier gas to the vaporization tank, a source gas extraction path along which flows a source gas which is obtained by vaporizing the source and which is extracted from the vaporization tank, a concentration monitor that is provided on the source gas extraction path, and a concentration control mechanism that is provided with a fluid controller which controls a concentration of the source gas extracted from the source gas extraction path. This vaporization device alternates between supplying the source gas and stopping the supply of the source gas. Moreover, the concentration control method includes a step in which an actual concentration of the source gas is calculated based on an output signal from the concentration monitor, a step in which, after first control has been performed in which a control value of the fluid controller forming part of the concentration control mechanism reaches to a predetermined initial setting value during a supply period when the source gas is being supplied, second control is subsequently performed in which, as a result of the fluid controller being controlled, feedback control is performed so that the actual concentration approaches a predetermined target value, and a step in which, based on changes in the actual concentration after the concentration control unit started the first control, the control state of the concentration control unit is switched from the first control to the second control.

According to the concentration control device having the above-described structure, it is possible to inhibit overshoot in the concentration of a source gas immediately after a gas supply period starts.

BEST EMBODIMENTS FOR IMPLEMENTING THE INVENTION

Hereinafter, a vaporization device according to the present invention will be described based on the drawings.

The vaporization device according to the present invention is incorporated, for example, into a semiconductor manufacturing line or the like, and is used to supply a predetermined concentration of gas to a chamber that is used in a semiconductor manufacturing process. Note that the vaporization device forms part of a film formation device that is used for semiconductor manufacturing and the like together with the chamber.

Figure 1:
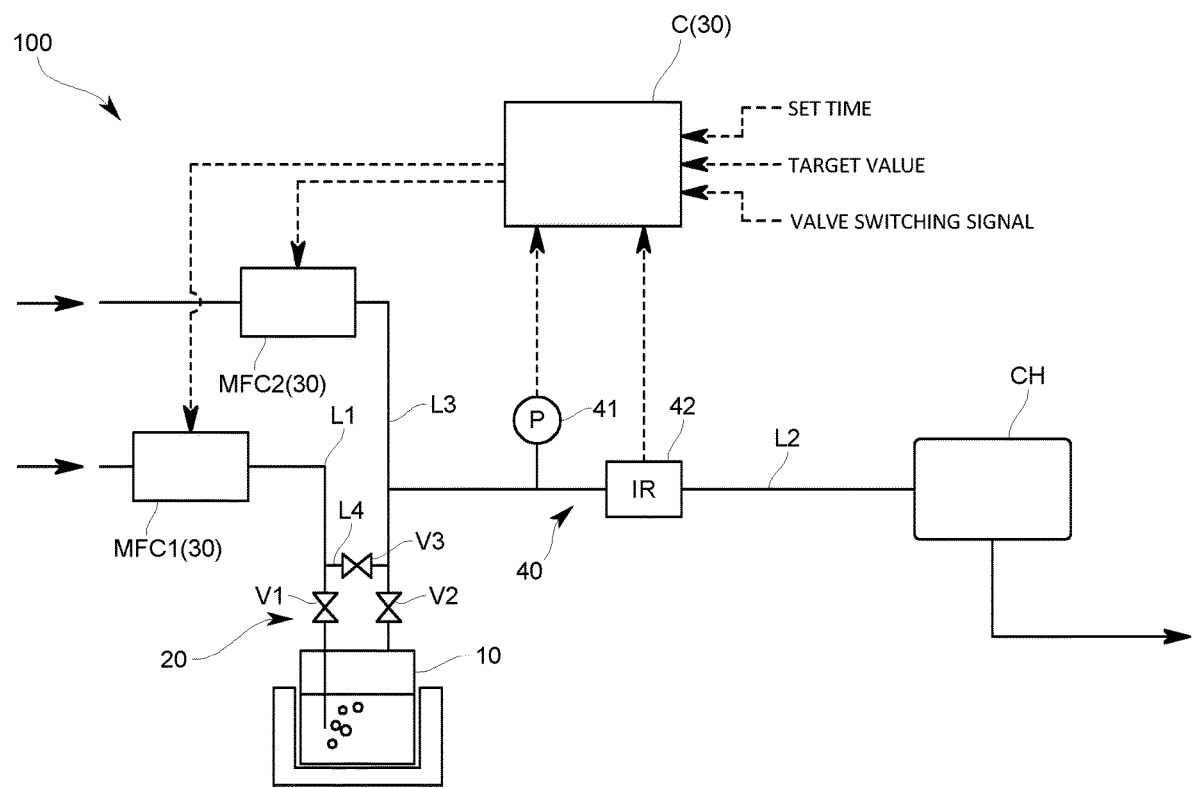
FIG. 1 is a schematic view showing a vaporization device according to an embodiment of the present invention.

A vaporization device 100 according to the present embodiment is what is known as a dilution type (flow rate type) of vaporization device and, as is shown in FIG. 1, is equipped with a vaporization tank 10 that holds a liquid or a solid source, a carrier gas supply path L1 that supplies carrier gas to the vaporization tank 10, a source gas extraction path L2 through which a source gas which is obtained by vaporizing the source is extracted from the vaporization tank 10, a dilution gas supply path L3 that supplies a dilution gas which dilutes the source gas to the source gas extraction path L2, a switching mechanism 20 that is used to switch between supplying the source gas to a chamber CH and stopping the supply of this source gas, and a concentration control mechanism 30 that controls the concentration of the source gas supplied to the chamber CH.

A first flow rate controller MFC1 that controls the flow rate of the carrier gas is provided on the carrier gas supply path L1. The first flow rate controller MFC1 is a mass flow controller that is equipped, for example, with a thermal flow rate sensor, a flow rate adjustment valve such as a piezo valve or the like, and a control circuit that is equipped with a CPU and memory and the like. The control circuit performs flow rate feedback control on the aperture of the flow rate adjustment valve based on a deviation between a set flow rate that is set by a control unit C (described below) and a measured flow rate that is measured by a flow rate sensor.

A concentration monitor 40 is provided on the source gas extraction path L2 on a downstream side from a merging point where the source gas extraction path L2 merges with the dilution gas supply path L3. Note that the concentration monitor 40 measures an actual concentration of a source gas that is contained in a mixture gas that is obtained by diluting the source gas using the dilution gas. The concentration monitor 40 of the present embodiment utilizes the fact that the actual concentration (vol %) of the source gas that is contained in the mixture gas is expressed as a ratio of the pressure (i.e., a partial pressure) of the source gas that is contained in the mixture gas relative to the pressure (i.e., the total pressure) of the mixture gas. More specifically, the concentration monitor 40 is provided with a pressure gauge 41 that measures total pressure, and a partial pressure gauge 42 that uses, for example, non-dispersive infrared spectroscopy to measure partial pressure.

A second flow rate controller MFC2 that controls the flow rate of the dilution gas is provided on the dilution gas supply path L3. In the same way as the first flow rate controller MFC1, the second flow rate controller MFC2 is a mass flow controller that is equipped, for example, with a thermal flow rate sensor, a flow rate adjustment valve such as a piezo valve or the like, and a control circuit that is equipped with a CPU and memory and the like. The control circuit performs flow rate feedback control on the aperture of the flow rate adjustment valve based on a deviation between a set flow rate that is set by a control unit C (described below) and a measured flow rate that is measured by a flow rate sensor.

The switching mechanism 20 has a plurality of valves V1 through V3 that open and close as a result of receiving a valve switching signal. If, for example, a user opens and closes the valves V1 through V3 of the switching mechanism 20 at preset timings, then the supply of carrier gas to the vaporization tank 10 and the stopping of this supply can be performed alternatingly. As a result, source gas is intermittently extracted from the vaporization tank 10 and is intermittently supplied to the chamber CH. In other words, in the vaporization device 100 of the present embodiment, a structure is employed in which a supply period during which a source gas (more specifically, a mixture gas) is supplied to the chamber CH alternates repeatedly with a non-supply period during which this supply of the source gas is stopped.

More specifically, the switching device 20 is provided with a detour flow path L4 that connects the carrier gas supply path L1 and the source gas extraction path L2 together, the first valve V1 that is provided on the carrier gas supply path L1 on the downstream side from a location where the carrier gas supply path L1 is connected to the detour flow path L4, the second valve V2 that is provided on the source gas supply path L2 on the upstream side from a location where the source gas supply path L2 is connected to the detour flow path L4, and the third valve V3 that is provided on the detour flow path L4.

The vaporization device 100 is also formed such that the supply period is put into operation by opening the first valve V1 and the second valve V2 of the switching mechanism 20 and closing the third valve V3 thereof, and such that the non-supply period is put into operation by closing the first valve V1 and the second valve V2 of the switching mechanism 20 and opening the third valve V3 thereof.

The concentration control mechanism 30 is provided with the first flow rate controller MFC1, the second flow rate controller MFC2, and a control unit C that controls the first flow rate controller MFC1 and the second flow rate controller MFC2. In other words, the flow rate controllers of the present embodiment are formed by the first flow rate controller MFC1 and the second flow rate controller MFC2.

Figure 2:
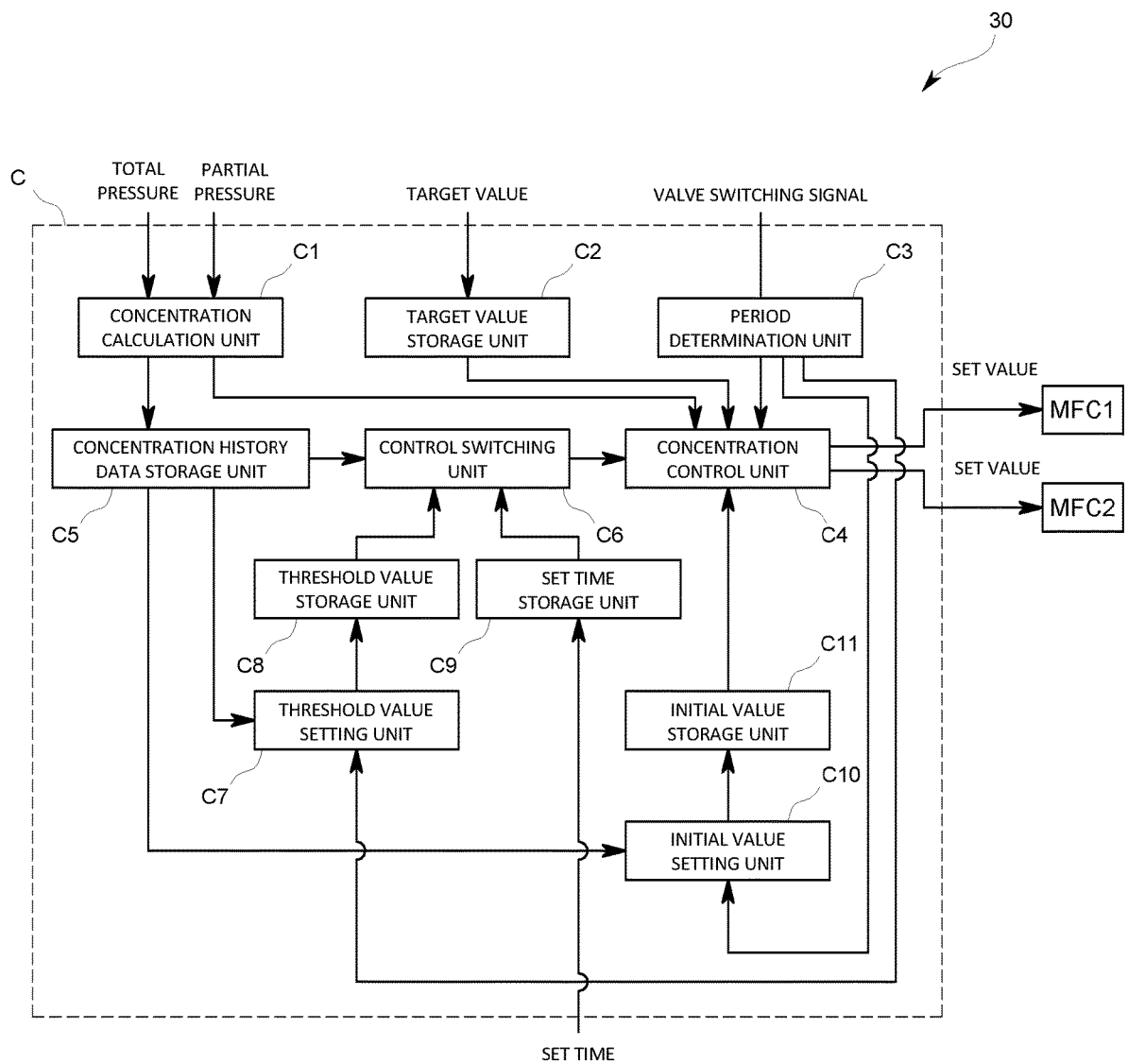
FIG. 2 is a block diagram showing functions of a concentration control mechanism in the vaporization device according to the embodiment of the present invention.

More specifically, the control unit C is a computer having a CPU, memory, an AD converter, a D/A converter, and input devices and the like. As is shown in FIG. 2, the control unit C is formed such that, as a result of a program stored in the memory being executed by the CPU, the control unit C functions as a concentration calculation unit C1, a target value storage unit C2, a period determination unit C3, a concentration control unit C4, a concentration change data storage unit C5, a control switching unit C6, a threshold value setting unit C7, a threshold value storage unit C8, a set time storage unit C9, an initial value setting unit C10, an initial value storage unit C11, and the like.

The concentration calculation unit C1 calculates the actual concentration of the source gas contained in the mixture gas based on output signals output from the concentration monitor 40. More specifically, the concentration calculation unit C1 acquires output signals from both the pressure gauge 41 and the partial pressure gauge 42, and calculates a ratio of a partial pressure detected by the partial pressure gauge 42 relative to a total pressure detected by the pressure gauge 41 as being the actual concentration (vol %) of the source gas contained in the mixture gas.

The target value storage unit C2 receives and stores a target value signal which shows a target concentration of the source gas supplied to a source gas supply destination (i.e., the chamber CH), and that was transmitted, for example, by means of an input operation performed by a user using an input device such as a keyboard or the like, or using some other device.

The period determination unit C3 receives valve opening/closing signals and determines whether or not a supply period is currently in operation.

Figure 3:
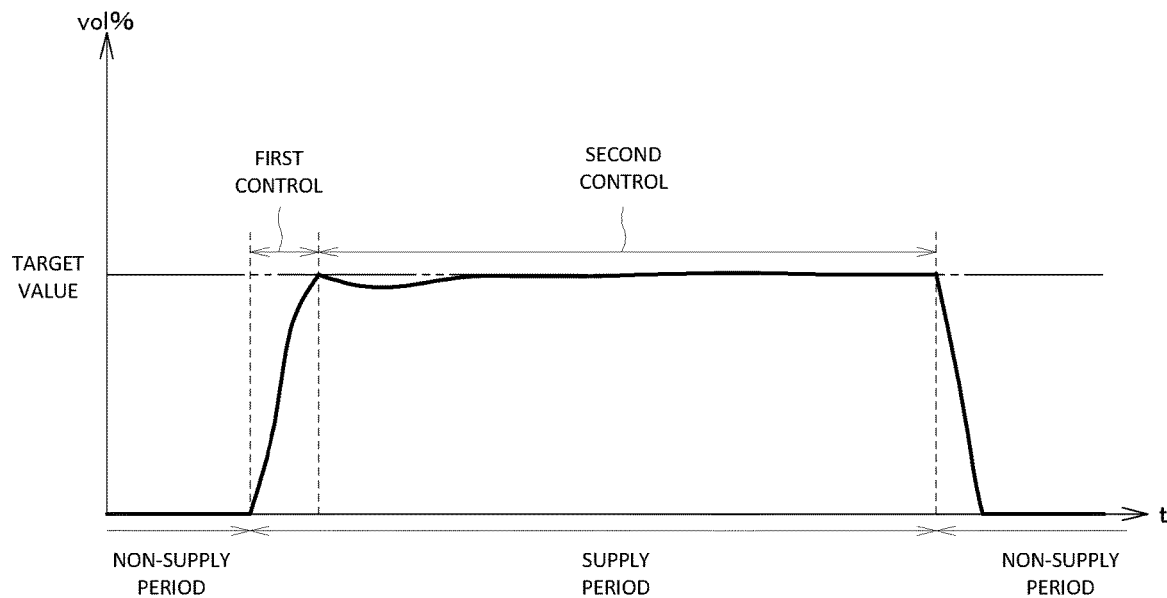
FIG. 3 is a graph showing changes in an actual concentration when a supply of a source gas and a stopping of this supply of the source gas are performed alternately by the vaporization device according to the embodiment of the present invention.
Figure 3:
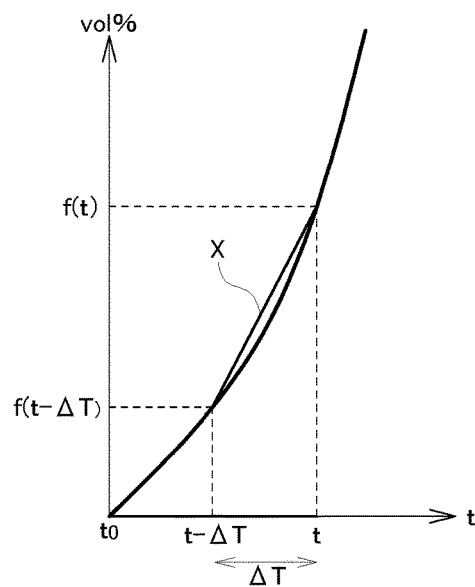

As is shown in FIG. 3, when the period determination unit C3 has determined that a supply period is currently in operation, the concentration control unit C4 acquires initial setting values which are stored in the initial value storage unit C11 (described below), and after performing first control so as to cause the flow rate flowing through the first flow rate controller MFC1 and the flow rate flowing through the second flow rate controller MFC2 to each arrive at the initial setting values, subsequently performs second control in which the concentration control unit C4 acquires an actual concentration signal output from the concentration calculation unit C1 and the target value signal stored in the target value storage unit C2, and performs feedback control such that, by controlling at least one of the first flow rate controller MFC1 or the second flow rate controller MFC2, the concentration control unit C4 causes the actual concentration to approach the target value. Note that, more specifically, the feedback control is PID control. Here, while the first control is being performed, the set flow rates of the first flow rate controller MFC1 and the second flow rate controller MFC2, which are mass flow controllers, are fixed at initial setting values that are held, for example, as constant flow rate values, and the actual concentration calculated by the concentration calculation unit C1 does not undergo feedback control in substantially real time relative to the respective set flow rates. In contrast to this, in the second control, the actual concentration does undergo feedback control in substantially real time relative to the respective set flow rates, and the set flow rates are sequentially altered. In other words, in the first control, the concentration feedback loop relative to the first flow rate controller MFC1 and the second flow rate controller MFC2 is severed, while in the second control, a concentration feedback loop is created relative to the first flow rate controller MFC1 and the second flow rate controller MFC2.

The concentration change data storage unit C5 acquires actual concentration signals which are output from the concentration calculation unit C1 after the concentration control unit C4 has started the first control, and stores concentration change data which shows changes over time in the actual concentration after this first control was started.

The control switching unit C6 switches the control state of the concentration control unit C4 from the first control to the second control based on the concentration change data stored in the concentration change data storage unit C5. More specifically, the control switching unit C6 of the present embodiment switches the control state of the concentration control unit C4 from the first control to the second control when a rate of change in the actual concentration in relation to the elapsed time after the first control was started falls below a threshold value. Still more specifically, the control switching unit C6 of the present embodiment is formed so as to output a switching signal to the concentration control signal C4 that causes the control state of the concentration control unit C4 to be switched from the first control to the second control when a rate of change in the actual concentration falls below a threshold value prior to the elapsed time since the first control was started exceeding a set time, or, alternatively, when this elapsed time exceeds a set time prior to the rate of change in the actual concentration falling below a threshold value.

The threshold values are set by the threshold value setting unit C7, and are stored in the threshold value storage section C8. More specifically, the threshold value setting unit C7 sets threshold values based on concentration change data obtained when the concentration control unit C4 performed the first control. Note that, when the period determination unit C3 determines that a supply period is currently in operation, then the threshold value setting unit C7 of the present embodiment sets the threshold values based on the concentration change data obtained in that supply period. In other words, the threshold value setting unit C7 sets threshold values for each separate supply period. More specifically, when the period determination unit C3 determines that a supply period is currently in operation, the threshold value setting unit C7 acquires concentration change data obtained in that supply period as this is required (i.e., in real time) from the concentration change data storage unit C5, and sets the threshold values based on this concentration change data.

Next, examples of threshold value setting methods employed by the threshold value setting unit C7 will be described.

A first method is one in which the threshold value setting unit C7 uses acquired concentration change data to calculate a rate of change in the actual concentration after a predetermined elapsed time from the point when the first control was started, and calculates and sets threshold values based on this rate of change in the actual concentration. More specifically, the threshold value setting unit C7 uses acquired concentration change data to calculate a rate of change in the actual concentration for a predetermined period after the first control was started as this is required, and then calculates and sets threshold values based on this rate of change in the actual concentration for a period corresponding to when a predetermined time has elapsed from the point when the first control was started. Still more specifically, the threshold value setting unit C7 calculates and sets threshold values based on the rate of change in the actual concentration for a first period from the point when the first control was started. In this case, the threshold value setting unit C7 sets as the threshold value a value that is 1/N (wherein N is an arbitrary number greater than 1) of the rate of change in the actual concentration. Here, if, for example, the control cycle is 1 second and the rate of change over predetermined periods of 5 seconds is calculated, then it is also possible for a portion of these predetermined periods to overlap with each other such as, for example, 0~5 seconds, 1~6 seconds, 2~7 seconds, etc.

A second method is one in which the threshold value setting unit C7 uses acquired concentration change data to calculate a maximum value of a rate of change in the actual concentration after the first control was started, and calculates and sets a threshold value based on this maximum value of the rate of change in the actual concentration. More specifically, the threshold value setting unit C7 uses acquired concentration change data to calculate rates of change in the actual concentration in predetermined periods after the first control was started as this is required, and then calculates and sets threshold values based on the maximum value of a rate of change in the actual concentration selected from among these. For example, the threshold value setting unit C7 may calculate the rates of change in the actual concentration in predetermined periods as this is required, and then select a maximum value by updating and storing the peak values thereof. In this case, the threshold value setting unit C7 sets as the threshold value a value that is 1/N (wherein N is an arbitrary number greater than 1) of the maximum value of the rate of change in the actual concentration.

Here, the rate of change in the actual concentration will be described in more detail. As is shown in FIG. 3(B) which is a partial enlargement of the graph shown in FIG. 3(a), this rate of change in the actual concentration is an inclination of a straight line X that joins an actual concentration at a start point and at an end point of a predetermined period $\Delta T$. If the actual concentration is taken as f(t), and the elapsed time is taken as t, then the rate of change in the actual concentration is a value calculated by $(f(t)-f(t-\Delta T))/\Delta T$. In other words, the rate of change in the actual concentration can also be described as an amount of change in the actual concentration relative to a unit time. In addition, instead of a straight line joining a start point and an end point of a predetermined period, it is also possible to determine an approximate straight line using least squares fitting for the concentration change data of a predetermined period, and to then calculate the rate of change in the actual concentration from the inclination of this approximate straight line.

In other words, in the present embodiment, a structure is employed in which, within a single supply period, a threshold value is set from concentration change data obtained via first control performed during that supply period, and the first control for that supply period is switched to the second control using this threshold value.

Note that in the present embodiment, by providing the threshold value setting unit C7, the threshold value is reset for each supply period, however, it is also possible to perform control without providing the threshold value setting unit C7 by storing predetermined threshold values in the threshold value storage unit C8, and then using these threshold values in any of the supply periods.

Figure 4:
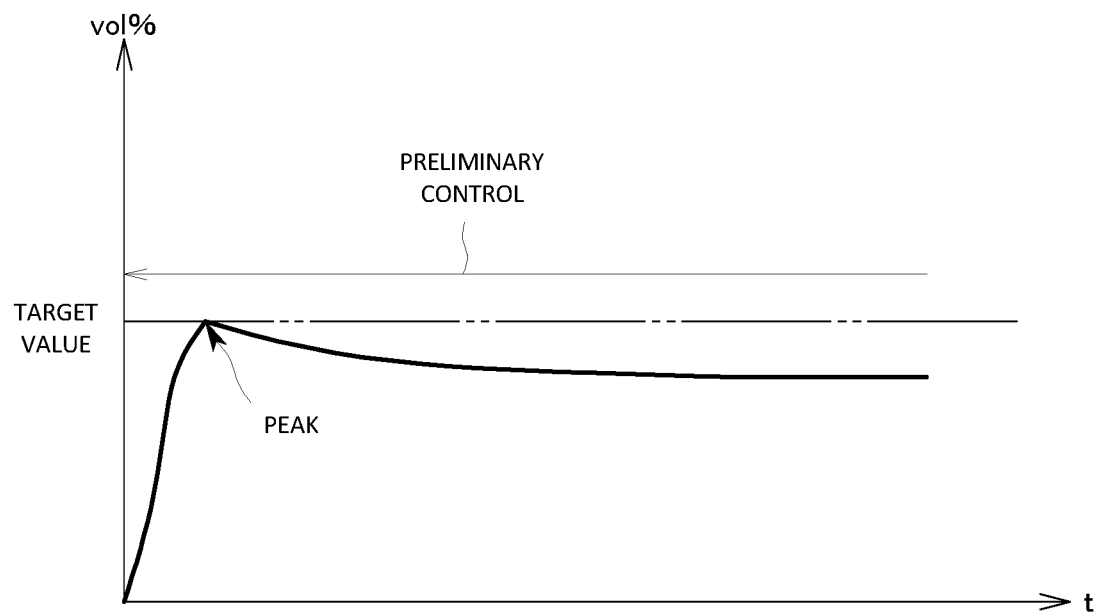
FIG. 4 is a graph showing changes in an actual concentration when preliminary control is performed by the vaporization device according to the embodiment of the present invention.

In this case, the threshold values may be calculated in advance using either one of the above-described methods from preliminary concentration change data (see FIG. 4) obtained by performing preliminary control prior to shipping the vaporization device 100 so as to ensure that the flow rate flowing through the first flow rate controller MFC1 and the flow rate flowing through the second flow rate controller MFC2 reach predetermined preliminary set values. Alternatively, the threshold values may instead be calculated from preliminary concentration change data obtained by performing the preliminary control after the vaporization device 100 has been assembled on a production line or the like. Furthermore, the threshold values may also be calculated from preliminary concentration change data obtained by performing the preliminary control using a first supply period in which a source gas is supplied by the vaporization device 100 to the chamber CH. Note that, as is shown in FIG. 4, when control is performed so as to ensure that the flow rate flowing through the first flow rate controller MFC1 and the flow rate flowing through the second flow rate controller MFC2 reach preliminary set values, then it is preferable that the preliminary set values be set such that a peak of the actual concentration reaches a target value or the vicinity of a target value. Note that the value of N in the first method or the second method can be set based on the preliminary concentration change data.

The set times are stored in the set time storage unit C9. Note that the set time storage unit C9 is able to receive and store set time signals transmitted, for example, by means of an input operation performed by a user using an input device such as a keyboard or the like, or using some other device. Note also that it is preferable that the set times be set after suitable margins have been added to the times when the actual concentrations in the preliminary concentration change data reach a peak.

When the period determination unit C3 determines that a non-supply period is in operation, the initial value setting unit C10 acquires concentration change data obtained in the previous supply period and stored in the concentration change data storage unit C5, and then calculates and sets initial setting values for the first flow rate controller MFC1 and the second flow rate controller MFC2 for the next supply period based on this acquired concentration change data. Note that the initial setting values may be the same values in both the first flow rate controller MFC1 and the second flow rate controller MFC2, or may be mutually different values in each. More specifically, the initial setting values are set such that, when the flow rates of the carrier gas and dilution gas are held constant at set flow rates Qc and Qd that are set in the first flow rate controller MFC1 and the second flow rate controller MFC2, the actual concentration that is measured by the concentration monitor 40 reaches the target concentration stored in the target value storage unit C2. For example, if the actual concentration is greater than the target concentration at the point when the first control ends, then the set flow rate Qc for the carrier gas that is used for the next supply period is set to a value that is smaller than the value currently used. Conversely, if the actual concentration is smaller than the target concentration at the point when the first control ends, then the set flow rate Qd for the carrier gas that is used for the next supply period is set to a value that is larger than the value currently used.

The initial value storage unit C11 receives and stores initial setting value signals from the initial value setting unit C10. More specifically, each time the initial value storage unit C11 receives an initial setting value signal from the initial value setting unit C10, the initial value storage unit C11 overwrites and stores the relevant initial setting values. Here, because the initial value setting unit C10 sets initial setting values based on concentration change data obtained in the previous supply period, it is unable to set initial setting values for the first supply period. Because of this, initial setting values for the first flow rate controller MFC1 and the second flow rate controller MFC2 to be used in the first supply period are stored in advance in the initial value storage unit C11. Note that the first initial setting values can be set based on the preliminary concentration change data.

Note also that in the present embodiment, by providing the initial value setting unit C10, the initial setting values are reset for each supply period, however, it is also possible to perform control without providing the initial value setting unit C10 by storing predetermined initial setting values (for example, first initial setting values) in the initial value storage unit C11, and then using these initial setting values in any of the supply periods.

Figure 5:
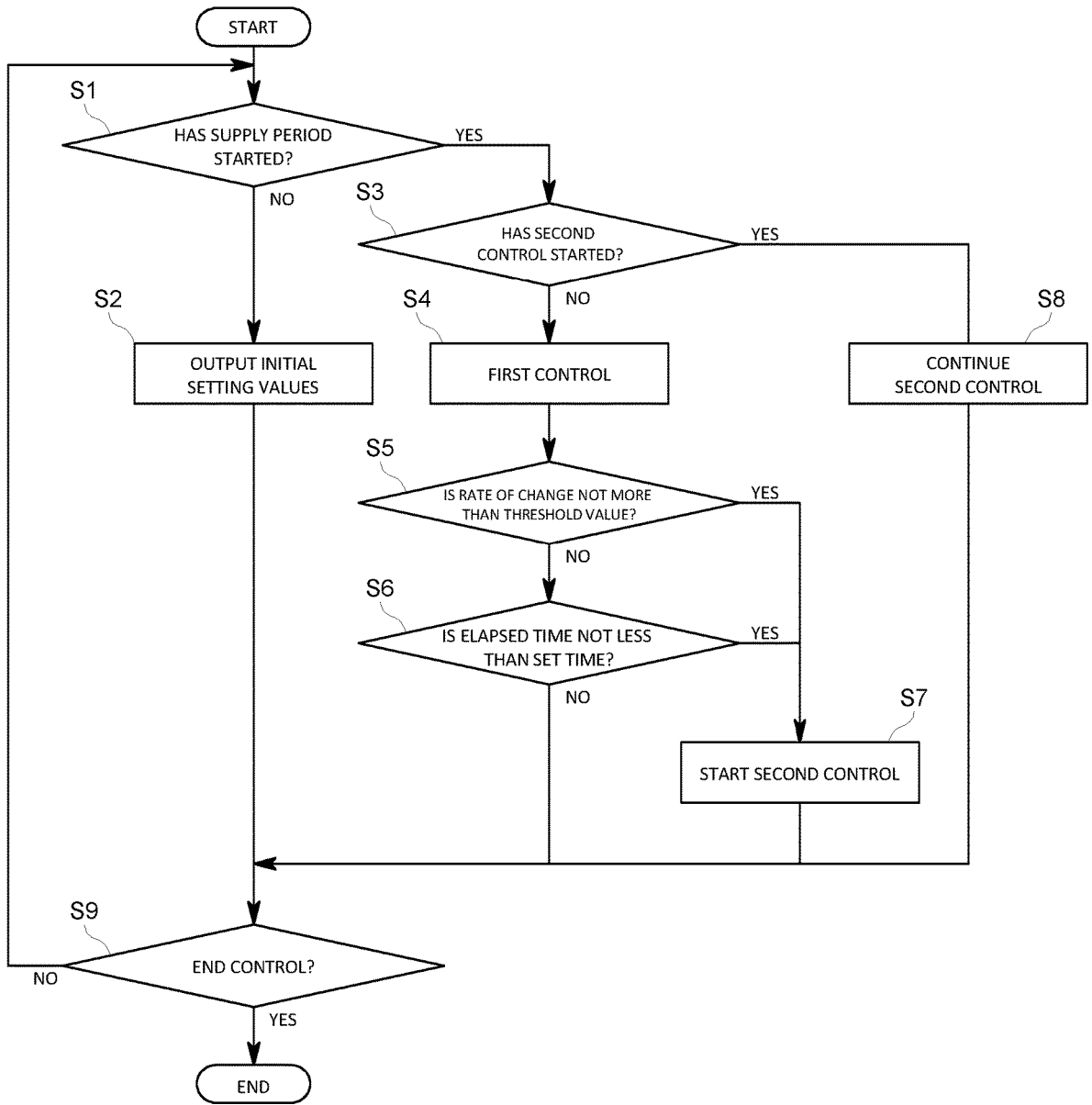
FIG. 5 is a flowchart showing operations of the vaporization device according to the embodiment of the present invention.

Next, an operation of the vaporization device 100 will be described based on FIG. 5.

Firstly, when an operation of the vaporization device 100 is started, the period determination unit C3 determines whether or not a supply period is currently in operation. In the present embodiment, the period determination unit C3 acquires a valve switching signal, and determines whether or not a supply period is currently in operation based on that signal (step S1).

If the period determination unit C3 determines that a supply period is currently not in operation, in other words, if it is determined that the current period is a non-supply period, then if concentration change data for the supply period immediately prior to that non-supply period is stored in the concentration change data storage unit C5, the initial value setting unit C10 sets new initial setting values based on that concentration change data and stores these new initial setting values in the initial value storage unit C11. The concentration control unit C4 then sets the latest initial setting values stored in the initial value storage unit C11 as the setting values of the first flow rate controller MFC1 and the second flow rate controller MFC2 (step S2).

If, on the other hand, the period determination unit C3 determines that a supply period is currently in operation, then the concentration control unit C4 determines whether or not the second control is in operation in the current control state (step S3). If it is determined that the second control is not in operation in the current control state, then the concentration control unit C4 performs the first control in which the flow rate flowing through the first flow rate controller MFC1 and the flow rate flowing through the second flow rate controller MFC2 are controlled so as to reach the initial setting values that have been set therefor (step S4).

Next, once the first control has been started by the concentration control unit C4, the concentration change data storage unit C5 sequentially stores concentration change data which shows changes in the actual concentration after the first control was started. In addition, the threshold value setting unit C7 sets threshold values based on the concentration change data stored in the concentration change data storage unit C5 as this is required, and stores these threshold values in the threshold value storage unit C8. Furthermore, the control switching unit C6 refers to the concentration change data sequentially stored in the concentration change data storage unit C5, and determines whether or not the rate of change in the actual concentration in relation to the elapsed time after the first control was started is equal to or less than the threshold value set by the threshold value setting unit C7 (step S5), and subsequently determines whether or not the this elapsed time is equal to or greater than a set time (step 6).

In other words, in the present embodiment a structure is employed in which, in each supply period the threshold value setting unit C7 sets threshold values based on the concentration change data obtained during that particular supply period, and, in addition, the control switching unit C6 determines a switching timing using the concentration change data and the relevant threshold values obtained in that supply period.

If it is determined that the rate of change in the actual concentration is equal to or less than the threshold value, or that the elapsed time is equal to or more than the set time, then the control switching unit C6 transmits a control state switching signal to the concentration control unit C4. As a result, the concentration control unit C4 switches the control state from the first control to the second control so as to start the second control (step S7).

Note that if the concentration control unit C4 determines in step S3 that the second control is in operation in the current control state, then the concentration control unit C4 causes the second control to continue (step S8).

Thereafter, the vaporization device 100 determines whether or not a control end signal has been received (step S9), and repeats steps S1 through S8 until a control end signal is received. When a control end signal is received, the operation of the vaporization device 100 is ended.

According to the vaporization device 100 of the present embodiment which has the above-described structure, immediately after a supply period has started, the first control is performed so as to maintain the flow rate flowing through the first flow rate controller MFC1 and the flow rate flowing through the second flow rate controller MFC2 at the initial setting values, and thereby raise the actual concentration, and then after the actual concentration has been raised by a particular amount, the control state is switched to the second control in which feedback control is performed so that the first flow rate controller MFC1 and the second flow rate controller MFC2 are controlled so as to cause the actual concentration to approach a target concentration. As a result, it is possible to inhibit overshoot in the concentration of a source gas immediately after a gas supply period has started.

A variant example of the present embodiment will now be described. In the first control, as is shown in the graphs in FIG. 3 and FIG. 4, the initial setting value Qc that is set for the first flow rate controller MFC1 is set so that the actual concentration as measured by the concentration monitor 40 at the point when the first control ends substantially matches the target value, however, it is also possible for the initial setting value Qc to be set so that the actual concentration overshoots the target value by a permissible amount. In other words, it is also possible to employ a structure in which the initial value setting unit C10 is formed such that a value obtained by multiplying an overshoot gain Go by a set flow rate Qc of the carrier gas that enables the actual concentration to reach the target concentration is set in the first flow rate controller MFC1 as the initial setting value. Here, the overshoot gain Go is set as a value such as, for example, 1.1~1.2 or the like. By employing this type of structure, as is shown in the graph in FIG. 6, it becomes possible to inhibit undershoot that is generated after overshoot, and ensure that, after the actual concentration has climbed above the target value, it does not then drop substantially below the target value again.

Additional Embodiments

Figure 6:
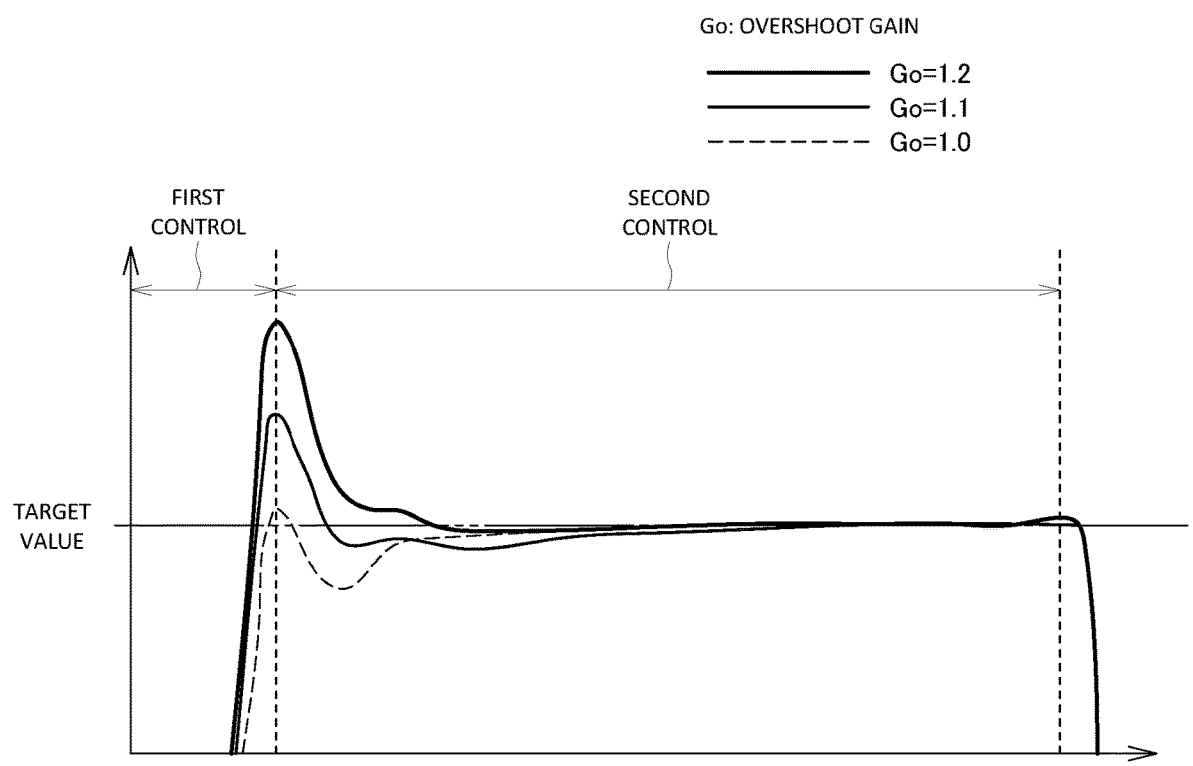
FIG. 6 is a graph showing changes in an actual concentration in a variant example of the vaporization device according to the embodiment of the present invention.
Figure 7:
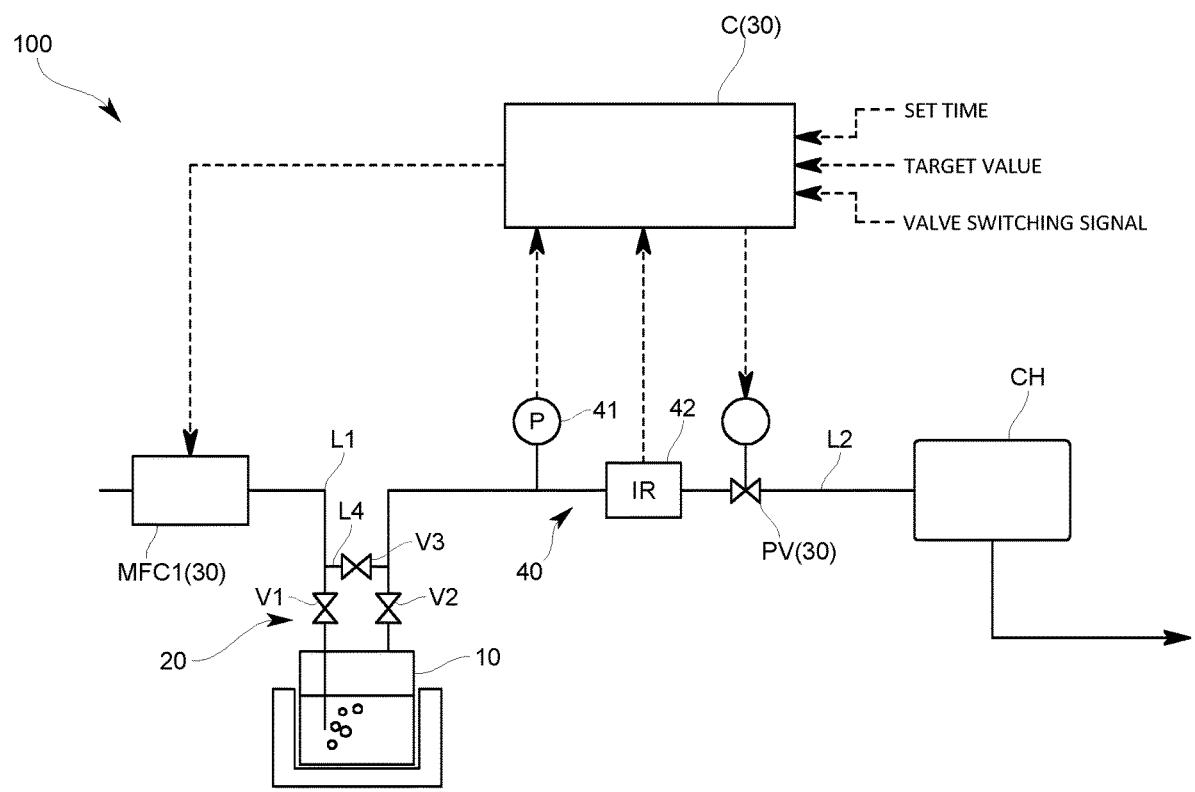
FIG. 7 is a schematic view showing a vaporization device according to another embodiment of the present invention.

The vaporization device 100 according to the above-described embodiment is a dilution type (i.e., a flow rate type) of device, however, it is also possible for a pressure type of device to be used. More specifically, as is shown in FIG. 6, compared to the dilution-type vaporization device 100 according to the above-described embodiment, a pressure-type vaporization device 100 is not equipped with the dilution gas supply path L3, but is instead equipped with a pressure controller PV that is located on the source gas extraction path L2 on the downstream side from the concentration monitor 40. In other words, the fluid controllers of the present embodiment are the flow rate controller MFC1 and the pressure controller PV.

In the above-described pressure-type vaporization device 100, a structure may be employed in which initial setting values for the flow rate flowing through the first flow rate controller MFC1 and the pressure on the upstream side from the pressure controller PV are stored in the initial value storage unit C11, and, in a supply period, after the concentration control unit C4 performs first control in which the pressure on the upstream side from the pressure controller PV (more specifically, the pressure in the pressure gauge 41) and the flow rate flowing through the first flow rate controller MFC1 are controlled so as to reach the initial setting values, the concentration control unit C4 subsequently performs second control in which, by controlling at least one of the first flow rate controller MFC1 and the pressure controller PV, the concentration control unit C4 performs feedback control so that the actual concentration approaches a target value. Note that, more specifically, the pressure controller PV is a pressure control valve, and the concentration control unit C4 is formed so as to control a valve aperture of this pressure control valve.

Note also that, in the pressure-type vaporization device 100 as well, if feedback control is performed so that the actual concentration approaches the target value immediately after a supply period has started, then the problem arises that there may be considerable overshoot in the concentration of the source gas immediately after the supply period starts due, for example, to time delays in the total pressure change in the vaporization tank which may be generated depending on the flow rate of the carrier gas flowing into the vaporization tank, and the like. However, according to the pressure-type vaporization device 100 according to the present invention, it is possible to inhibit overshoot in the concentration of a source gas immediately after the start of a supply period.

Moreover, in the above-described embodiment, the timing of a switch from the first control to the second control is determined based on the rate of change in the actual concentration in relation to the elapsed time after the first control was started, however, it is also possible to employ a structure in which the timing of a switch from the first control to the second control is determined based on the rate of change in this rate of change in the actual concentration (i.e., a second order derivative of a waveform of the actual concentration).

Moreover, the change in the actual concentration in relation to the elapsed time is unstable immediately after the first control has started, in other words, immediately after a supply period has started. For this reason, it is also possible to employ a structure in which a delay time is provided after the first control has started, and the control switching unit C6 determines whether or not the rate of change in the actual concentration in relation to the elapsed time after this delay time has ended is equal to or less than a threshold value. If this type of structure is employed, then it is possible to inhibit erroneous determinations that tend to occur easily in this period when the change in the actual concentration in relation to the elapsed time is unstable.

Furthermore, it should be understood that the present invention is not limited to the above-described embodiments, and that various modifications and the like may be made thereto insofar as they do not depart from the spirit or scope of the present invention.

DESCRIPTION OF THE REFERENCE NUMERALS

100 Vaporization Device
10 Vaporization Tank
L1 Carrier Gas Supply Path
L2 Source Gas Extraction Path
L3 Dilution Gas Supply Path
20 Switching Mechanism
30 Concentration Control Mechanism
MFC1 First Flow Rate Controller
MFC2 Second Flow Rate Controller
C Control Unit
C1 Concentration Calculation Unit
C2 Target Value Storage Unit
C3 Period Determination Unit
C4 Concentration Control Unit
C5 Concentration Change Data Storage Unit
C6 Control Switching Unit
C7 Threshold Value Setting Unit
C8 Threshold Value Storage Unit
C9 Set Time Storage Unit
C10 Initial Value Setting Unit
C11 Initial Value Storage Unit
40 Concentration Monitor
PV Pressure Controller

What is claimed is:

1. A vaporization device that comprises: a vaporization tank that holds a liquid or a solid source; a carrier gas supply path that supplies carrier gas to the vaporization tank; a source gas extraction path along which flows a source gas which is obtained by vaporizing the source and which is extracted from the vaporization tank; a concentration monitor that is provided on the source gas extraction path; and a concentration control mechanism that is provided with a fluid controller which controls a concentration of the source gas extracted from the source gas extraction path, and that alternates between supplying the source gas and stopping the supply of the source gas, wherein the concentration control mechanism comprises:

a concentration calculation unit that calculates an actual concentration of the source gas based on an output signal from the concentration monitor;

a concentration control unit that, after performing first control so as to cause a control value of the fluid controller forming part of the concentration control mechanism to arrive at a predetermined initial setting value during a supply period when the source gas is being supplied, subsequently performs second control in which the concentration control unit performs feedback control by controlling the fluid controller so as to ensure that the actual concentration approaches a predetermined target value; and a control switching unit that, based on a difference value in the actual concentration of the source gas over time after the concentration control unit has started the first control, switches the control state of the concentration control unit from the first control to the second control.

2. The vaporization device according to claim 1, wherein there is further provided a dilution gas supply path that merges with the source gas extraction path and supplies dilution gas to the source gas extraction path, and the concentration control mechanism is provided with the fluid controllers in the form of a first flow rate controller that is provided on the carrier gas supply path and a second flow rate controller that is provided on the dilution gas supply path, and, during the supply period when the source gas is being supplied, after the concentration control unit has performed the first control in which a flow rate flowing through the first flow rate controller and a flow rate flowing through the second flow rate controller are controlled respectively so that each flow rate reaches a predetermined initial setting value, the concentration control unit subsequently performs second control in which the concentration control unit performs feedback control so as to ensure that the actual concentration approaches a predetermined target value by controlling at least one of the flow rate flowing through the first flow rate controller and the flow rate flowing through the second flow rate controller.

3. The vaporization device according to claim 1, wherein the concentration control mechanism is provided with the fluid controllers in the form of a flow rate controller that is provided on the carrier gas supply path and a pressure controller that is provided on the source gas extraction path on a downstream side from the concentration monitor, and, during the supply period when the source gas is being supplied, after the concentration control unit has performed first control in which the flow rate flowing through the flow rate controller and a pressure on an upstream side from the pressure controller are controlled respectively so that each of these reaches a predetermined initial setting value, the concentration control unit subsequently performs second control in which the concentration control unit performs feedback control so as to ensure that the actual concentration approaches a predetermined target value by controlling at least one of the flow rate flowing through the flow rate controller and the pressure on the upstream side from the pressure controller.

4. The vaporization device according to claim 1, wherein the control switching unit switches the control state of the concentration control unit from the first control to the second control based on a rate of change in the actual concentration in relation to the elapsed time after the first control was started.

5. The vaporization device according to claim 4, wherein the control switching unit switches the control state of the concentration control unit from the first control to the second control when the rate of change in the actual concentration falls below a threshold value.

6. The vaporization device according to claim 5, wherein the control switching unit switches the control state of the concentration control unit from the first control to the second control when, prior to the rate of change in the actual concentration falling below a threshold value, the elapsed time exceeds a predetermined set time.

7. The vaporization device according to claim 5, wherein there is further provided a threshold value setting unit that sets a threshold value based on changes in the actual concentration after the concentration control unit started the first control.

8. The vaporization device according to claim 7, wherein the threshold value setting unit sets a threshold value based on a maximum value of the rate of change in the actual concentration after the first control was started, or on the rate of change in the actual concentration at a point in time when a predetermined time has elapsed after the first control was started.

9. The vaporization device according to claim 7, wherein the threshold value setting unit resets threshold values in each of the supply periods based on changes in the actual concentration after the first control was started for that supply period.

10. The vaporization device according to claim 1, wherein a predetermined delay time is provided after the start of the first control, and the control switching unit switches the control state of the concentration control unit from the first control to the second control based on changes in the actual concentration after this delay period.

11. The vaporization device according to claim 1, wherein the vaporization device further comprises an initial value setting unit that sets, as the initial setting value, a value obtained by multiplying overshoot gains whose value is one or more by a set value that has been determined so as to enable the actual concentration to reach a preset target value.

12. A film formation device comprising:

the vaporization device according to claim 1; and a chamber to which the source gas is supplied.

13. A program recording medium on which is recorded a program for a concentration control mechanism that is used in the vaporization device according to claim 1.

14. A method that is used in the vaporization device according to claim 1 for implementing the concentration control mechanism of claim 1.

* * * * *